United States Patent
Chaganti et al.

(10) Patent No.: US 9,615,262 B1
(45) Date of Patent: Apr. 4, 2017

(54) ANTENNA PLACEMENT DETERMINATION DEVICE

(71) Applicant: AT&T Intellectual Property I, L.P., Atlanta, GA (US)

(72) Inventors: Phanishankar Chaganti, Frisco, TX (US); Kaushik D. Gohel, Southlake, TX (US)

(73) Assignee: AT&T Intellectual Property I, L.P., Atlanta, GA (US)

( * ) Notice: Subject to any disclaimer, the term of this patent is extended or adjusted under 35 U.S.C. 154(b) by 0 days.

(21) Appl. No.: 14/953,824

(22) Filed: Nov. 30, 2015

(51) Int. Cl.
  *H04B 17/00*  (2015.01)
  *H04W 16/18* (2009.01)
  *H04W 24/08* (2009.01)

(52) U.S. Cl.
  CPC .......... *H04W 16/18* (2013.01); *H04W 24/08* (2013.01)

(58) Field of Classification Search
  None
  See application file for complete search history.

(56) References Cited

U.S. PATENT DOCUMENTS

| | | | |
|---|---|---|---|
| 7,000,357 B1* | 2/2006 | Stearns | H01Q 1/3216 52/110 |
| 7,706,812 B2 | 4/2010 | Liu et al. | |
| 8,588,128 B2 | 11/2013 | Aguirre et al. | |
| 8,671,431 B2 | 3/2014 | Centore, III et al. | |
| 8,688,027 B2 | 4/2014 | Aguirre et al. | |
| 2002/0115447 A1* | 8/2002 | Martin | G06Q 20/202 455/456.3 |
| 2012/0320057 A1* | 12/2012 | Gutierrez | G06T 17/05 345/427 |
| 2015/0035704 A1 | 2/2015 | Schwengler et al. | |

FOREIGN PATENT DOCUMENTS

CN 103079268 5/2013

* cited by examiner

*Primary Examiner* — Mohammed Rachedine
(74) *Attorney, Agent, or Firm* — Hartman & Citrin LLC

(57) ABSTRACT

Concepts and technologies are disclosed herein for an antenna placement determination device. An antenna placement determination device can include a signal sensor located at a first end of an extendible arm, a platform located proximate to a second end of the extendible arm, a drive system connected to the platform, and an actuator connected to the extendible arm. The actuator can be configured to extend and collapse the extendible arm. The signal sensor can be connected to the extendible arm by a joint, and a sensor actuator or sensor motor can rotate the signal sensor about the joint. The drive system can include a drive motor and a drive mechanism that is configured to transport the antenna placement determination device.

20 Claims, 13 Drawing Sheets

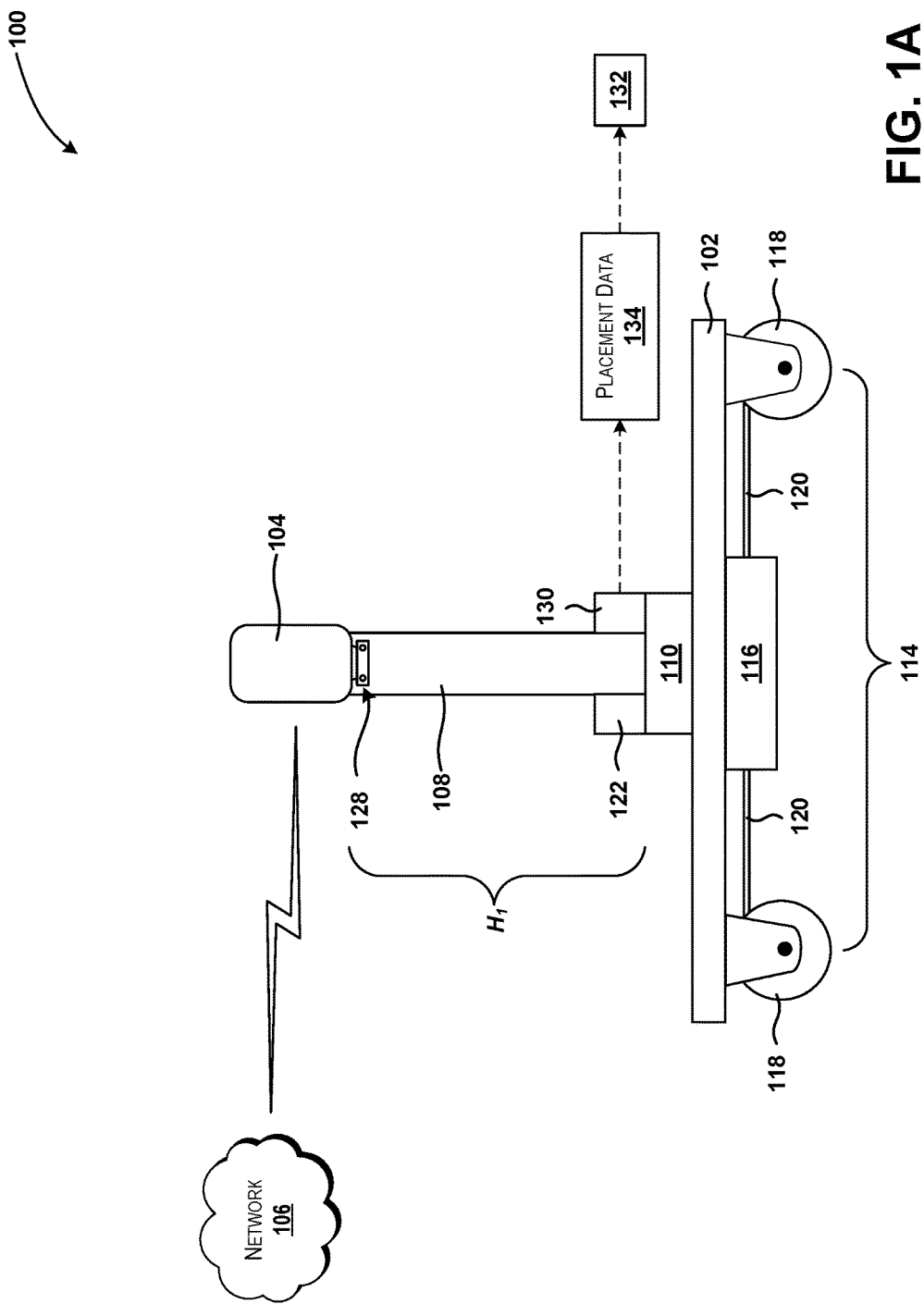

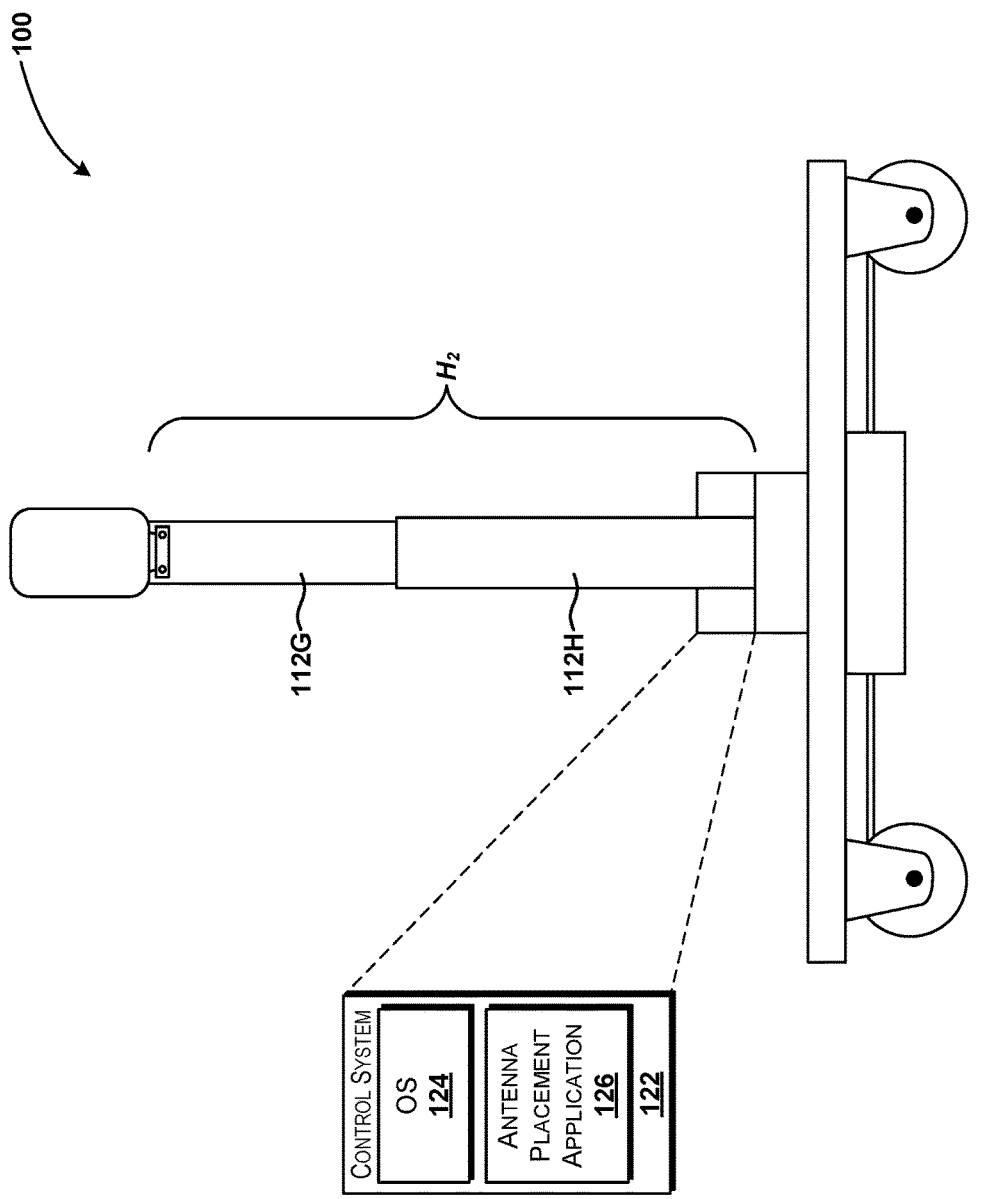

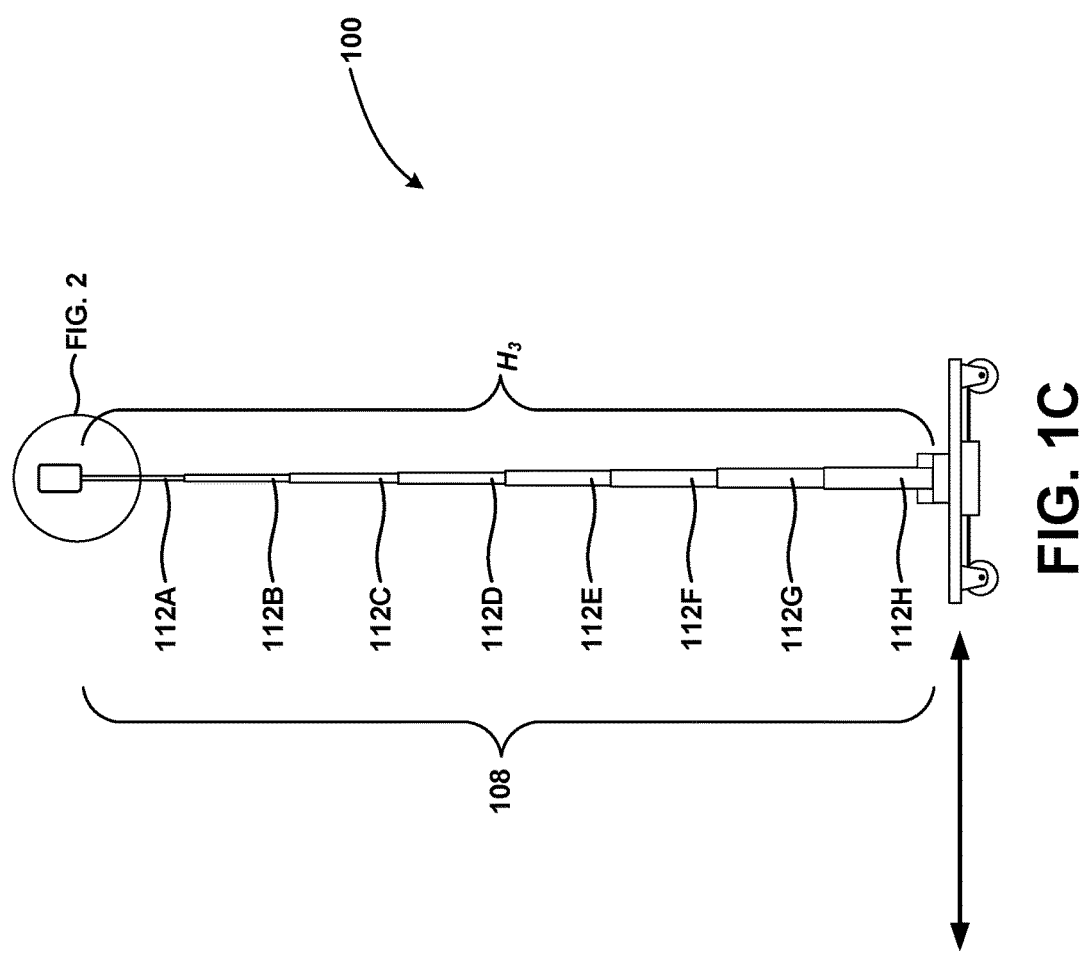

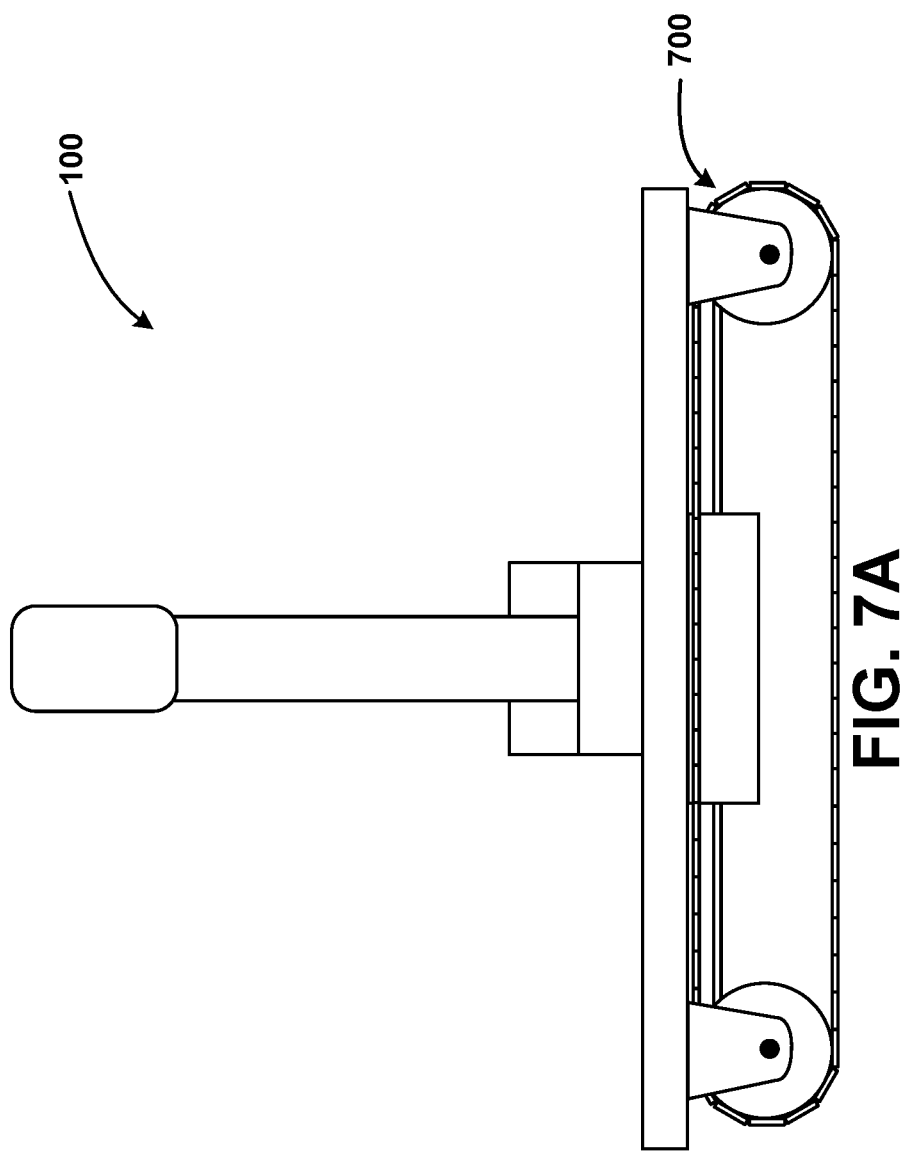

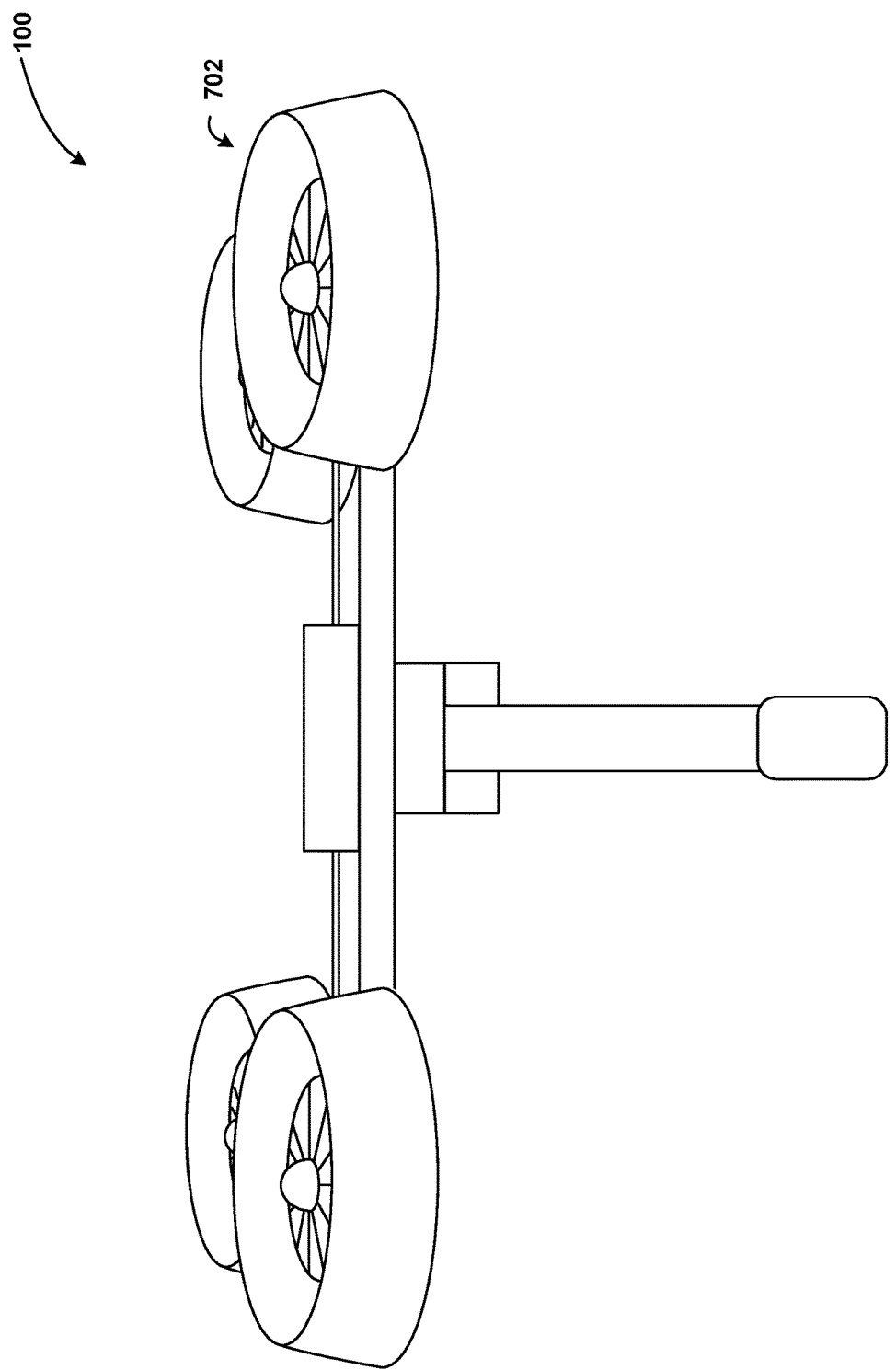

ANTENNA PLACEMENT DETERMINATION DEVICE

BACKGROUND

Some phone, Internet, television, and/or data services may rely upon a customer premises equipment or customer provided equipment ("CPE") device such as an antenna, a satellite dish, a gateway, a router, or the like. During installations, upgrades, and/or at other times, a service provider or other entity may install the CPE and/or components thereof at a location such as a home, office, venue, outdoor area, or the like. If the CPE relies upon wirelessly transmitted signals (e.g., radio signals, television signals, data signals, radio frequency ("RF") signals, or the like), the installation location of the CPE may be determined as part of the installation process in an attempt to optimize the reception of the signals by the CPE or CPE component.

In some instances, installation of CPE or CPE components can include identification of a satellite, a server, or another device or system that provides the signals received by the CPE or CPE component. The identification of the device or system may be used to determine a location (relative to the installation location) of the device or system. Knowledge of this location may be used to aim the antenna, dish, or other component of the CPE.

The relative location of the device or system, however, may not be precise. As such, the installation of the CPE or CPE component may not be optimal in terms of receiving signals, and therefore may have to be moved. Changing the location of CPE and/or components thereof after a first installation may not be desirable, as such installations and/or removal of the CPE and/or components thereof may adversely affect the aesthetic appearance of the customer premises.

BRIEF DESCRIPTION OF THE DRAWINGS

FIGS. 1A-1C are line drawings showing an antenna placement determination device, according to various embodiments of the concepts and technologies described herein.

FIGS. 7A-7B are line drawings showing additional aspects of the antenna placement determination device, according to various embodiments of the concepts and technologies described herein.

DETAILED DESCRIPTION

Figure 2:
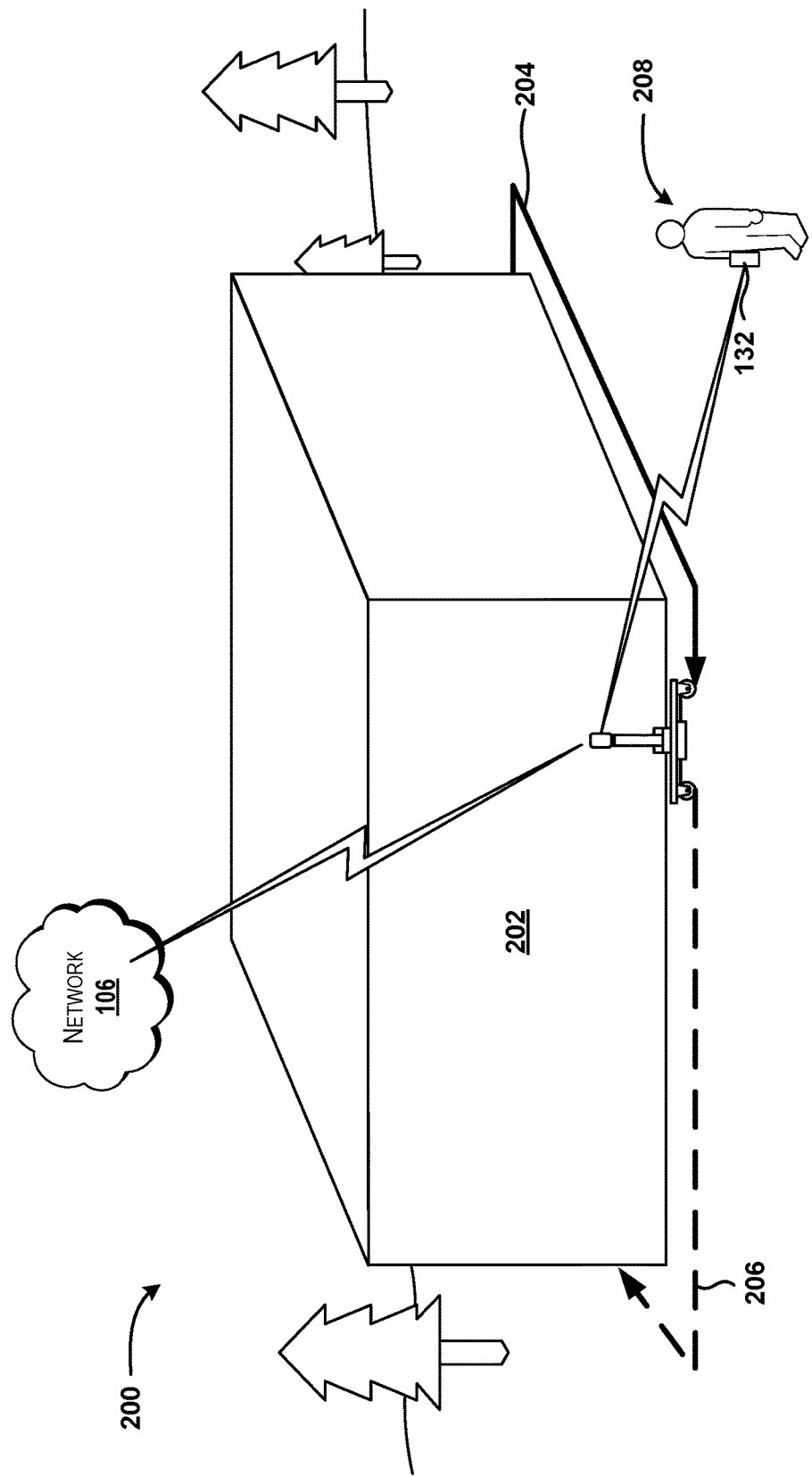
FIG. 2 illustrates an example operating environment for the antenna placement determination device, according to an example embodiment of the concepts and technologies described herein.

The following detailed description is directed to an antenna placement determination device. The antenna placement determination device can include a platform, an extendible arm that can be connected to the platform, a signal sensor that can be located at the extendible arm, and a drive system that can move the antenna placement determination device. The antenna placement determination device can be located in an area, region, building, venue, home, office, or the like. The antenna placement determination device can travel within the area. In some embodiments, the antenna placement determination device can travel around, at, or near a perimeter of the area. While travelling along the path, or at various points along the path, the antenna placement determination device can be configured to extend the extendible arm and/or rotate the signal sensor within various planes and/or about various axes. At various points in time during movement of the extendible arm and/or rotation of the signal sensor about various axes, the antenna placement determination device can measure signals detected by the signal sensor. The signals detected by the signal sensor can correspond to communication signals associated with a network and/or a portion thereof.

Based at least partially upon the measured signals, the antenna placement determination device can detect a location at which an optimal signal strength or signal reception exists. In particular, the antenna placement determination device can determine a location and/or orientation of the signal sensor when the optimal signal strength or signal reception is detected, and this location and/or orientation can be determined by the antenna placement determination device to correspond to an optimal mounting location for hardware such as an antenna of a customer premises equipment ("CPE") or the like.

The antenna placement determination device can be configured to generate placement data that can indicate a geographic location of the antenna placement determination device when the optimum signal reception or signal strength are detected, an orientation of the signal sensor at that time, and/or other information. In some embodiments, the placement data also can indicate that a current location/orientation corresponds to an optimal placement (without providing location and/or orientation information). The antenna placement determination device can transmit the placement data to an entity. The entity can be informed that an ideal placement location for hardware such as an antenna has been identified. In some other embodiments, the control system of the antenna placement determination device can cause a marking assembly or other component of the antenna placement determination device to mark a mounting location in the area, on a building or other structure, or elsewhere; or to even begin the installation of the mounting hardware or CPE or CPE component. The antenna placement determination device therefore can be used to identify and mark a mounting location for hardware, or to even initiate installation of hardware, according to various embodiments of the concepts and technologies described herein.

According to one aspect of the concepts and technologies disclosed herein, an antenna placement determination device is disclosed. The antenna placement determination device can include a signal sensor located proximate to a first end of an extendible arm. The signal sensor can be connected to the extendible arm by a joint, and the signal sensor can be configured to be rotated about the joint. The antenna placement determination device also can include a platform located proximate to a second end of the extendible arm and an actuator connected to the extendible arm. The actuator can be configured to extend and collapse the extendible arm. The antenna placement determination device also can include a drive system connected to the platform. The drive system can include a drive motor and a drive mechanism.

In some embodiments, the antenna placement determination device can also further include a marking assembly. The marking assembly can be located proximate to the first end of the extendible arm. The marking assembly can include a marking mechanism that can be used to mark a location at which an antenna associated with customer premises equipment should be mounted. In some embodiments, the marking mechanism includes a paint nozzle. In some embodiments, the marking assembly can be configured to attach mounting hardware at the location at which the antenna should be mounted. In some embodiments, the drive mechanism includes two or more wheels, and one wheel of the two or more wheels can be powered by the drive motor.

In some embodiments, the antenna placement determination device can also include a control system and a transceiver. The control system can be configured to generate placement data and transmit the placement data directed to a remote device via the transceiver. In some embodiments, the placement data can include location data that indicates a geographic location of the antenna placement determination device; height data that indicates a height of the extendible arm; and orientation data that indicates an orientation of the signal sensor. In some embodiments, the control system can determine the height data by tracking movement of the extendible arm by the actuator. In some embodiments, the drive mechanism includes two or more propellers that are powered by the drive motor. In some embodiments, the drive mechanism includes two or more tracks. In some embodiments, the signal sensor can be configured to be rotated about three axes located at the joint.

According to another aspect of the concepts and technologies disclosed herein, another embodiment of the antenna placement determination device is disclosed. The antenna placement determination device can include a signal sensor located proximate to a first end of an extendible arm. The signal sensor can be connected to the extendible arm by a joint, and the signal sensor can be configured to be rotated about the joint. The antenna placement determination device also can include a platform located proximate to a second end of the extendible arm, and an actuator connected to the extendible arm. The actuator can be configured to extend and collapse the extendible arm. The antenna placement determination device also can include a drive system connected to the platform. The drive system can include a drive motor and a drive mechanism. The drive system can be configured to transport the antenna placement determination device. The antenna placement determination device also can include a control system that can control the drive motor and the actuator.

In some embodiments, the antenna placement determination device can include a marking assembly. The marking assembly can be located proximate to the first end of the extendible arm. The marking assembly can include a marking mechanism that can be used to mark a location at which an antenna associated with customer premises equipment should be mounted. In some embodiments, the antenna placement determination device can include a transceiver. The control system can be configured to generate placement data and transmit the placement data directed to a remote device via the transceiver. In some embodiments, the placement data can include location data that indicates a geographic location of the antenna placement determination device; height data that indicates a height of the extendible arm; and orientation data that indicates an orientation of the signal sensor.

According to yet another aspect of the concepts and technologies disclosed herein, yet another embodiment of the antenna placement determination device is disclosed. The antenna placement determination device can include a signal sensor located proximate to a first end of an extendible arm. The signal sensor can be connected to the extendible arm by a joint, and the signal sensor can be configured to be rotated about the joint. The antenna placement determination device also can include a platform located proximate to a second end of the extendible arm and an actuator connected to the extendible arm. The actuator can be configured to extend and collapse the extendible arm. The antenna placement determination device also can include a drive system connected to the platform. The drive system can include a drive motor and two or more wheels. The drive system can be configured to transport the antenna placement determination device. The antenna placement determination device also can include a control system that controls the drive motor and the actuator.

In some embodiments, the antenna placement determination device can include a marking assembly. The marking assembly can be located proximate to the first end of the extendible arm. The marking assembly can include a marking mechanism that can be used to mark a location at which an antenna associated with customer premises equipment should be mounted. In some embodiments, the antenna placement determination device can include a transceiver. The control system can be configured to generate placement data and transmit the placement data directed to a remote device via the transceiver. The placement data can include location data that indicates a geographic location of the antenna placement determination device; height data that indicates a height of the extendible arm; and orientation data that indicates an orientation of the signal sensor.

Other systems, devices, methods, and/or computer program products according to embodiments will be or become apparent to one with skill in the art upon review of the following drawings and detailed description. It is intended that all such systems, devices, methods, and/or computer program products be included within this description, and be within the scope of this disclosure.

Referring now to FIGS. 1A-1C, aspects of an antenna placement determination device 100 will be described, according to one illustrative embodiment. As will be explained in more detail herein, the antenna placement determination device 100 shown in FIG. 1 is one example embodiment of the concepts and technologies described herein and therefore should not be construed as being limiting in any way.

In the illustrated embodiment, the antenna placement determination device 100 includes a platform 102. In some embodiments of the antenna placement determination device 100, the platform 102 can function as a backbone for the antenna placement determination device 100, and as such, various structures and/or components of the antenna placement determination device 100 can be attached to, connected to, and/or formed on the platform 102. While the platform 102 is illustrated in FIGS. 1A-1C as being substantially planar, it should be understood that other shapes are contemplated and are possible for the platform 102. As such, the illustrated embodiment should be understood as being illustrative and should not be construed as being limiting in any way.

The antenna placement determination device 100 also can include a signal sensor 104. The signal sensor 104 can include an antenna, a receiver, a transceiver, a signal detector, and/or other hardware and/or software. The signal sensor 104 can be configured to detect signals and/or the strength of detected signals, as well as other aspects of the detected signals such as frequencies, and the like. According to various embodiments of the concepts and technologies described herein, the signals detected by the signal sensor 104 can be emitted from one or more devices associated with various types of networks such as the network 106. Various aspects of the network 106 are illustrated and described in more detail below (particularly with reference to FIG. 8), but briefly it should be understood that the signals can include, but are not limited to, satellite television signals, satellite audio signals, terrestrial audio and/or data signals such as cellular network signals and the like, signals associated with personal area network devices such as WiFi hotspots and the like, television signals, radio signals, other types of signals, combinations thereof, or the like.

According to various embodiments of the concepts and technologies described herein, the signal sensor 104 can be located at a first end of an arm such as an extendible arm 108 or other mechanism. The signal sensor 104 can be connected to the extendible arm 108, attached to the extendible arm 108, and/or otherwise located at or proximate to an end of the extendible arm 108 (e.g., via a joint, a connector, a coupling, a hinge, or the like). Some embodiments of a joint or mount that can be used to locate the signal sensor 104 at an end of the extendible arm 108 will be illustrated and described in more detail below, particularly with reference to FIG. 4.

The extendible arm 108 can include various types of extendible structures. In some contemplated embodiments, as is clear with reference to FIGS. 1A-1C, the functionality of the extendible arm 108 can be provided by a telescoping structure. Thus, the extendible arm 108 can be extended and/or collapsed via un-nesting and/or nesting (respectively) the structures of the extendible arm 108, as is easiest seen with collective reference to FIGS. 1A-1C. It should be understood that this example is illustrative and therefore should not be construed as being limiting in any way.

According to various embodiments of the concepts and technologies described herein, the extendible arm 108 and/or components thereof can be driven by a device such as, for example, a motor or an actuator such as the actuator 110. According to various embodiments, the actuator 110 can extend or collapse the members of the extendible arm 108. Thus, for example, power can be applied to the actuator 110, and the actuator 110 can drive the extendible arm 108 to un-nest the components of the extendible arm 108 to extend the extendible arm 108, or to nest the components of the extendible arm 108 to collapse the extendible arm 108. As shown in FIG. 1C, the extendible arm 108 can include any number of extendible arm component members 112A-H (hereinafter collectively and/or generically referred to as "arm component members 112"). Thus, while FIG. 1C illustrates eight arm component members 112, it should be understood that the extendible arm 108 can include less than eight, eight, and/or more than eight arm component members 112. As such, the illustrated embodiment should be understood as being illustrative of the concepts and technologies described herein and should not be construed as being limiting in any way.

As can be seen with collective reference to FIGS. 1A-1C, the actuator 110 can extend the extendible arm 108 from a first height $H_1$ as shown in FIG. 1A, a second height $H_2$ as shown in FIG. 1B, and/or a third height $H_3$ as shown in FIG. 1C; to other heights via un-nesting the arm component members 112 to thereby lengthen the extendible arm 108. Similarly, the actuator 110 can collapse the arm component members 112 of the extendible arm 108 to thereby collapse the extendible arm 108 from the third height $H_3$, second height $H_2$, and/or other heights to the second height $H_2$, the first height $H_1$, and/or other heights. It should be understood that these examples are illustrative and therefore should not be construed as being limiting in any way.

The antenna placement determination device 100 also can include a drive system 114. The drive system 114 can be used to provide mobility for the antenna placement determination device 100 and/or to allow transport of the antenna placement determination device 100. In particular, the drive system 114 can be provided to enable the antenna placement determination device 100 to move within and/or along a location such as, for example, a border of a location, a perimeter of a location, an area, a region, a building, or the like. Thus, the drive system 114 can enable the antenna placement determination device 100 to move through or within various locations as will be more clearly understood with reference to the other FIGURES illustrated and described herein.

The drive system 114 can include, but is not limited to, one or more drive motors 116, one or more wheels 118, one or more drive shafts 120, one or more other components, combinations thereof, or the like. According to various embodiments of the concepts and technologies described herein, one or more of the components of the drive system 114 can be substituted for other elements or components. For example, in some embodiments of the concepts and technologies described herein, the wheels 118 may be substituted for other devices, components, systems, or the like. It should be understood that these examples are illustrative and therefore should not be construed as being limiting in any way.

The drive motor 116 can be configured to drive one or more of the wheels 118 to move the antenna placement determination device 100 through, within, from, or to a location. It should be understood that in some embodiments, the drive motor 116 can be controlled by other devices or elements to distribute force generated by the drive motor 116 to one or more of the wheels 118 to control and/or steer movement of the antenna placement determination device 100. Additionally, or alternatively, one or more of the wheels 118 can be steered in some embodiments, and such steering and/or control of power from the drive motor 116 to other components can be controlled by components of the antenna placement determination device 100. It should be understood that this example is illustrative and therefore should not be construed as being limiting in any way.

In some embodiments of the concepts and technologies described herein, the antenna placement determination device 100 includes a control system 122. The control system 122 can include hardware and/or software that can steer and/or control movement of the antenna placement determination device 100 (e.g., steering and or movement as explained above), collect sensor data from various sensors and/or systems of the antenna placement determination device 100 (e.g., the signal sensor 104) as illustrated and described herein, to generate output, and/or to control other functions of the antenna placement determination device 100 as illustrated and described herein.

The functionality of the control system 122 can be provided by a processor and a memory (not visible in FIGS. 1A-1C). When instructions stored in the memory are executed by the processor, the processor can cause the antenna placement determination device 100 (or the processor itself) to perform various operations as illustrated and described herein. As shown in FIG. 1B, the control system 122 can include an operating system 124 and one or more application programs such as, for example, an antenna placement application 126. The operating system 124 can include a computer program that can control the operation of the control system 122 and/or the antenna placement determination device 100. The antenna placement application 126 can include an executable application program configured to execute on top of the operating system 124 to provide various functions as illustrated and described herein. The functionality of the antenna placement application 126 will be illustrated and described in more detail below after introducing other components of the antenna placement determination device 100.

The antenna placement determination device 100 also can include a marking assembly 128. Additional details of the marking assembly 128 will be illustrated and described below, particularly with reference to FIGS. 3-6. Briefly, the marking assembly 128 can be configured to mark a mounting surface of a building or other structure to which an antenna is to be mounted to denote a location at which the antenna is to be mounted. Various embodiments of the marking assembly 128 include the use of paints, sprays, pins, stickers, or other marking technologies to mark a location at which an antenna or other CPE component is to be or should be mounted. Thus, the antenna placement determination device 100 can identify a mounting position for an antenna or other CPE component and mark that position. In some other embodiments, the marking assembly 128 can be substituted for an installation assembly, which can initiate installation of the hardware such as an antenna or other CPE component. Because the marking assembly 128 and/or installation assembly are optional in some embodiments, it should be understood that these embodiments are illustrative and therefore should not be construed as being limiting in any way.

The antenna placement determination device 100 also can include a transceiver 130. The transceiver 130 can be configured to transmit and/or receive data. According to various embodiments, the transceiver 130 can be used transmit data to and/or receive data from a remote device such as a remote control, a remote computer, a control device, or the like ("remote device") 132. According to various embodiments, the control system 122 can be configured to generate placement data 134. The placement data 134 can represent a placement location for an antenna, other CPE component, or other hardware and can be defined in a number of manners, as will be explained in more detail below.

In some embodiments, for example, the placement data 134 can indicate that a present position of the antenna placement determination device 100 (and/or components thereof such as the extendible arm 108, the signal sensor 104, or the like) corresponds to a suggested or ideal placement position for hardware, e.g., an antenna or other CPE component, as detected by the antenna placement determination device 100. Thus, in some embodiments, the placement data 134 can include location data. The location data can indicate a geographic location of the antenna placement determination device 100 when an optimal placement location is identified (e.g., when an optimal signal reception or signal strength is identified). As such, the location data can include, for example, coordinates generated using a global positioning system ("GPS") receiver and/or variants thereof such as A-GPS, or the like.

Additionally, or alternatively, the placement data 134 can include height data. The height data can indicate a height, which can be tracked by the control system 122 and can correspond to a height at which the signal sensor 104 is located when an optimal placement location is identified (e.g., when an optimal signal reception or signal strength is identified). It can be appreciated that the control system 122 can be configured to track the length of the extendible arm 108 (e.g., via tracking movement of the extendible arm 108 such as extension thereof or collapsing thereof) and as such, the height of the signal sensor 104. It should be understood that this example is illustrative and therefore should not be construed as being limiting in any way.

Additionally, or alternatively, the placement data 134 can include orientation data that can indicate an orientation of the signal sensor 104 when an optimal placement location is identified (e.g., when an optimal signal reception or signal strength is identified). As will be appreciated with reference to FIGS. 3-6 and the description thereof, the signal sensor 104 can be rotated about an x, y, and/or z axis and/or in planes formed by combinations thereof (e.g., an x-y plane; a z-x plane, a z-y plane, other planes, or the like). Thus, the orientation data can indicate a degree of rotation in one or more of these three axes and/or in one or more planes. It should be understood that this example is illustrative and therefore should not be construed as being limiting in any way.

The placement data 134 can be output by the antenna placement determination device 100 and transmitted to other devices (e.g., the remote device 132), a remote storage device or service (not shown in FIG. 1), a visual display located at or on the antenna placement determination device 100 (not illustrated in FIG. 1), and/or otherwise output by the antenna placement determination device 100. In some other embodiments, the antenna placement determination device 100 can additionally (or alternatively) include a display, and the placement for the hardware such as the antenna or other CPE component can be displayed on the display. It should be understood that this example is illustrative and therefore should not be construed as being limiting in any way.

With additional reference to FIG. 2, the concepts and technologies described herein for providing an antenna placement determination device 100 will be explained in additional detail. In particular, FIG. 2 illustrates an example operating environment 200 for embodiments of the antenna placement determination device 100, according to an example embodiment. Because the antenna placement determination device 100 can be used in various operating environments, it should be understood that the illustrated operating environment 200 is one example and therefore should not be construed as being limiting in any way.

As shown in FIG. 2, the operating environment 200 can include a structure such as a building 202. According to various embodiments, the building 202 can correspond to a place of business, a home, an office, a store, or the like. In some other embodiments, the antenna placement determination device 100 may be used in other types of locations such as outdoor areas, venues, locations, towns, regions, combinations thereof, or the like. As such, it should be understood that this example is illustrative and therefore should not be construed as being limiting in any way.

As shown in FIG. 2, the antenna placement determination device 100 can be located in the operating environment 200. The antenna placement determination device 100 can travel within an area. In some embodiments, as shown in FIG. 2, the antenna placement determination device 100 can travel around, at, or near a perimeter of the building 202. In particular, the antenna placement determination device 100 can travel along a path, which can include a travelled portion of the path ("travelled path") 204 and a portion of the path to be travelled ("travel path") 206. It should be understood that this example is illustrative and therefore should not be construed as being limiting in any way.

While travelling along the path, or at various points along the path, the antenna placement determination device 100 can be configured to extend the extendible arm 108 and/or rotate the signal sensor 104 within various planes and/or about various axes as will be explained in more detail herein. While extending the extendible arm 108 and/or rotating the signal sensor 104 about various axes or with various planes, the antenna placement determination device 100 (and/or the control system 122) can measure signals detected by the signal sensor 104. As shown in FIG. 2, and as explained above, the signals detected by the signal sensor 104 can correspond, in various embodiments, to communication signals associated with a network 106 and/or a portion thereof. It should be understood that this example is illustrative and therefore should not be construed as being limiting in any way.

When an optimal signal strength is detected (optimal signal strength can be defined in various manners) by the control system 122 or other component of the antenna placement determination device 100, the antenna placement determination device 100 (or the control system 122) can determine that a current location and/or orientation of the signal sensor 104 corresponds to an optimal mounting location for hardware such as an antenna or other CPE component. The antenna placement determination device 100 can be configured to generate placement data 134. As noted above, the placement data 134 can indicate a geographic location of the antenna placement determination device 100, an orientation of the signal sensor 104, a height of the signal sensor 104, and/or other information. The placement data 134 also can indicate that a current location/orientation corresponds to an optimal placement (without providing location and/or orientation information), if desired. The antenna placement determination device 100 can transmit the placement data 134 to an entity (e.g., a remote device 132 held by a technician or other entity ("technician") 208, or the like) or display the placement data 134. Thus, the technician 208 or other entity can be informed that an ideal placement location for hardware such as an antenna has been identified.

In some other embodiments, as mentioned above, the control system 122 of the antenna placement determination device 100 can cause the marking assembly 128 to mark a mounting location on the building 202 or other structure. Thus, for example, the marking assembly 128 can emit paints, stickers, cutting tools, or the like, for marking or otherwise indicating the mounting location for the hardware. In some other embodiments, an installation assembly can begin installing the hardware at the determined location. Thus, the antenna placement determination device 100 can be used to identify and mark a mounting location for hardware or even to begin mounting the hardware, according to various embodiments. It should be understood that these examples are illustrative and therefore should not be construed as being limiting in any way.

FIG. 2 illustrates one antenna placement determination device 100, one network 106, and one building 202. It should be understood, however, that various implementations of the operating environment 200 can include zero, one, or more than one antenna placement determination device 100; zero, one, or more than one network 106; and/or zero, one, or more than one building 202 (or other structure or area as explained above). As such, the illustrated embodiment should be understood as being illustrative, and should not be construed as being limiting in any way.

Figure 3:
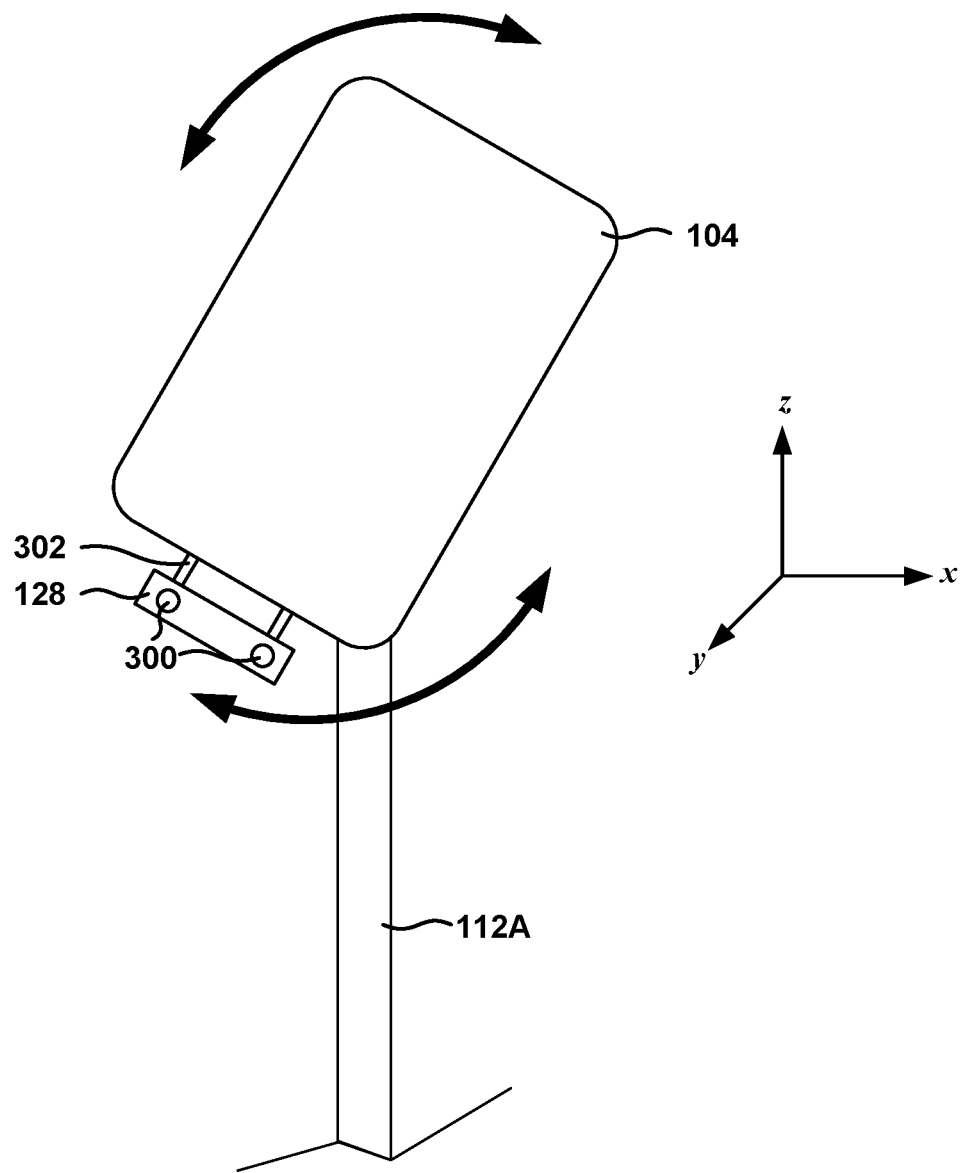
FIGS. 3-6 are line drawings illustrating additional aspects of the antenna placement determination device, according to various embodiments of the concepts and technologies described herein.

Turning now to FIG. 3, additional details of the concepts and technologies described herein for an antenna placement determination device 100 will be described in detail. FIG. 3 is an expanded view of the signal sensor 104 and some example neighboring structures as depicted by the viewing circle shown in FIG. 1C. Because many variations can be made to the signal sensor 104 and/or the neighboring structures illustrated and described herein, it should be understood that the illustrated example is illustrative and therefore should not be construed as being limiting in any way.

Figure 4:
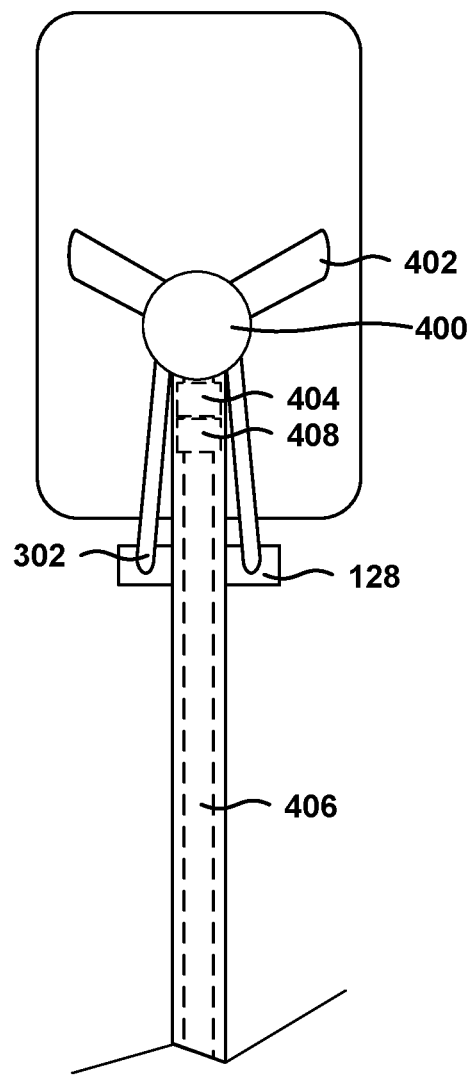

FIG. 3 depicts a portion of the extendible arm 108, namely the arm component member 112A. As shown in FIG. 3, the signal sensor 104 can be located at or near an end of the extendible arm 108 and/or a component thereof such as one or more of the arm component members 112. Although not visible in FIG. 3, the signal sensor 104 can be attached (via one or more structures or mechanisms) to a joint, coupling, or other structure that can be located at or near the end of the extendible arm 108. The joint or other structure (one example embodiment of the joint is shown in FIG. 4) can enable rotation of the signal sensor 104 about various axes and/or in various planes.

As shown in FIG. 3, the joint or other structure can enable rotation of the signal sensor 104 in an x-z plane, among other planes. In various embodiments of the concepts and technologies described herein, the signal sensor 104 can be rotated about the x-z plane and the presence and/or strength of measured signals detected by the signal sensor 104 can be tracked during this rotation. Thus, the signal sensor 104 can be rotated to detect differences in signal strength and/or differences in detected reception of signals based on orientation in the x-z plane. It can be appreciated that the signal strength and/or reception of signals in general may change based on orientation in the x-z plane due to polarization of signals (horizontal, vertical, circular, or the like). Thus, the rotation of the signal sensor 104 within the x-z plane can be accomplished to identify an ideal orientation of an antenna or other hardware to maximize perceived signal strength and/or signal reception at a particular location. Because the signal sensor 104 can be rotated for other purposes, and because the perceived signal strength and/or reception of signals may change for additional and/or alternative reasons, it should be understood that this example is illustrative and therefore should not be construed as being limiting in any way.

Also visible in FIG. 3 are some of the structures of an example embodiment of the marking assembly 128. It should be appreciated that the marking assembly 128 can be located at other locations (relative to the signal sensor 104), and as such the illustrated embodiment is illustrative and should not be construed as being limiting in any way. The marking assembly 128 can include various structures and/or devices for marking a location, structure, or the like with a mounting location. In the embodiment shown in FIG. 3, the marking assembly 128 includes two marking mechanisms 300. It should be understood that the marking assembly 128 may include only a single marking mechanism 300, and as such, the illustrated embodiment is illustrative and should not be construed as being limiting in any way.

In the illustrated embodiment, the marking assembly 128 includes two marking mechanisms 300, and the functionality of the marking mechanisms 300 is provided by two paint nozzles. The marking assembly 128 can be controlled by the control system 122 to spray paint through the nozzles or other marking mechanisms 300. The paint can be a temporary paint and/or an invisible paint that may be rendered visible only under certain conditions (e.g., UV light, or the like). In some other embodiments, the marking mechanisms 300 can be configured to apply stickers to a surface; to scratch or otherwise mark the surface; to mount brackets, pins, nails, or other mounting hardware; or to otherwise mark a mounting a location. Thus, the marking assembly 128 can be used to mark a mounting location (or to begin the mounting process) for mounting hardware such as an antenna of a CPE or other CPE components. It should be understood that this example is illustrative and therefore should not be construed as being limiting in any way.

In the embodiment shown in FIG. 3, the marking assembly 128 is mounted to the extendible arm 108 or the signal sensor 104 by one or more marking assembly mounts 302. The marking assembly mounts 302 can include, in some embodiments, paint lines that can be pressurized by a motor, actuator, or other device under the control of the control system 122 to cause the marking assembly 128 to emit paint from the marking mechanisms 300. It should be understood that this example is illustrative and therefore should not be construed as being limiting in any way.

Turning now to FIG. 4, additional details of the concepts and technologies described herein for an antenna placement determination device 100 will be described in detail. In particular, FIG. 4 is a rear view of the embodiment of the signal sensor 104 shown in FIG. 3. Because the illustrated rear view is illustrative of one contemplated example embodiment, the embodiment shown in FIG. 4 should not be construed as being limiting in any way.

As shown in FIG. 4, the signal sensor 104 can be connected to a universal joint or other structure ("joint") 400. Although not illustrated in detail in FIG. 4, the joint 400 can include internal gears and one or more other structures that can enable the joint 400 (or components or portions thereof) to be rotated about various axes and/or within various planes as illustrated and described herein. According to various contemplated embodiments, the signal sensor 104 can be connected to the joint 400 by one or more mounting arms or other structures ("signal sensor mounts") 402. According to various embodiments, the marking assembly mounts 302 and the signal sensor mounts 402 can connect to the joint 400. It should be understood that this example is illustrative and therefore should not be construed as being limiting in any way.

As shown in FIG. 4, one or more gears 404 can be located at or near the joint 400. The gears 404 can be used to control movement of the joint 400 in or within the various planes illustrated and described herein. Thus, the extendible arm 108 also can include a motor or actuator shaft 406, which can accommodate various structures for turning the gears 404 and/or otherwise controlling movement of the joint 400. In some embodiments, a signal sensor motor or signal sensor actuator can be configured to drive the gears 404 to effect movement of the signal sensor 104. Additionally, or alternatively, the signal sensor motor or signal sensor actuator can change which of the gears 404 are engaged by the motor or actuator shaft 406 and thereby change how the signal sensor 104 is moved. Thus, FIG. 4 also shows a signal sensor motor 408, though it can be appreciated that the signal sensor motor 408 may not be included in some embodiments and/or that the signal sensor motor 408 may be substituted for other actuators, controls, or the like. Because additional and/or alternative structures can be included in various embodiments, it should be understood that the illustrated example is illustrative and therefore should not be construed as being limiting in any way.

Figure 5:
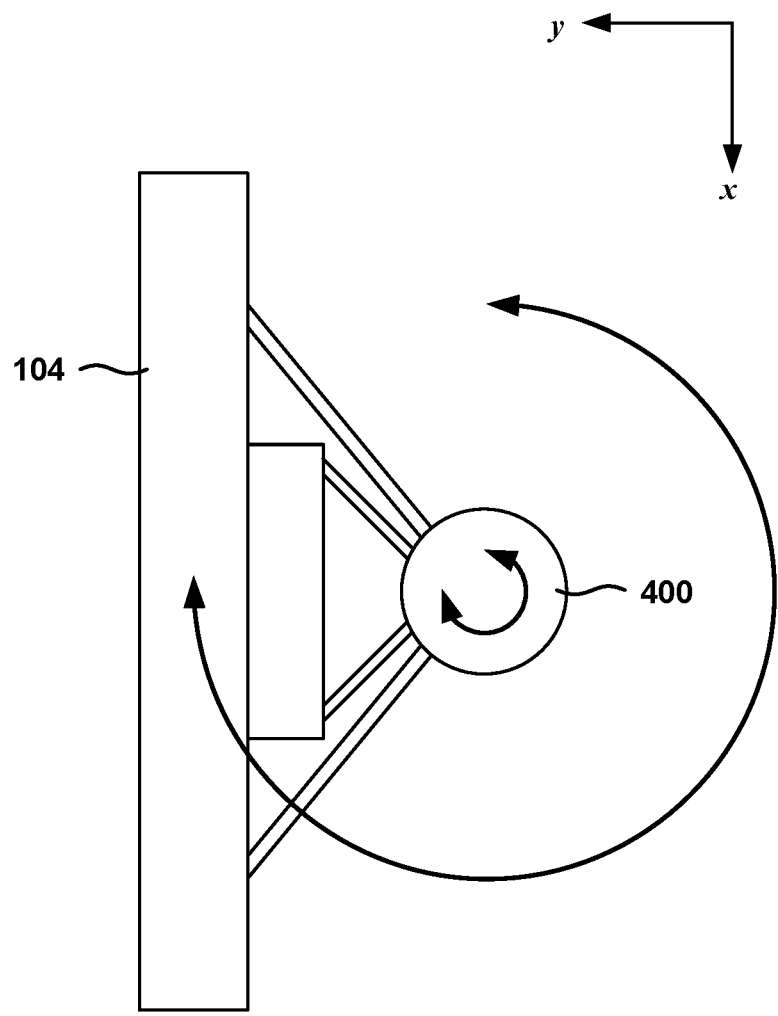

Turning now to FIG. 5, additional details of the concepts and technologies described herein for an antenna placement determination device 100 will be described in detail. In particular, FIG. 5 is a top view of the embodiment of the signal sensor 104 shown in FIGS. 3-4, according to an example embodiment. Because the illustrated top view is illustrative of one contemplated example embodiment, the embodiment shown in FIG. 5 should not be construed as being limiting in any way.

As shown in FIG. 5, the joint 400 can enable rotation of the signal sensor 104 (and optionally the marking assembly 128) in an x-y plane, among other planes. In various embodiments of the concepts and technologies described herein, the signal sensor 104 can be rotated about the x-y plane and the strength of measured signals and/or the reception of signals detected by the signal sensor 104 can be tracked during this rotation. Thus, the signal sensor 104 can be rotated to detect differences in signal strength and/or signal reception based on orientation in the x-y plane. It can be appreciated that the signal strength and/or signal reception may change based on orientation in the x-y plane as a result of facing (or not facing) a signal emitter from which the measured signals are transmitted. Thus, the rotation of the signal sensor 104 within the x-y plane can be accomplished to identify an ideal orientation of an antenna or other hardware to maximize perceived signal strength and/or signal reception at a particular location. Because the signal sensor 104 can be rotated for other purposes, and because the perceived signal strength and/or signal reception may change for additional and/or alternative reasons, it should be understood that this example is illustrative and therefore should not be construed as being limiting in any way.

Figure 6:
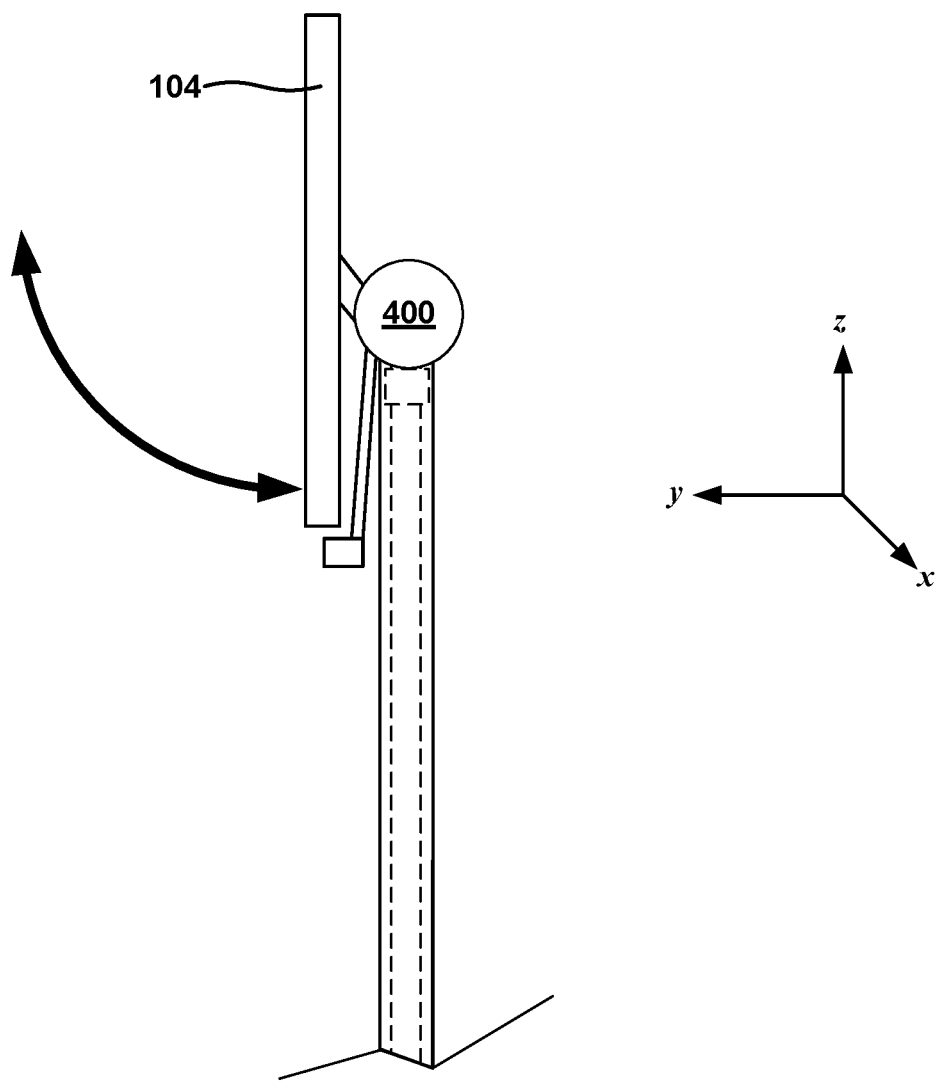

Turning now to FIG. 6, additional details of the concepts and technologies described herein for an antenna placement determination device 100 will be described in detail. In particular, FIG. 6 is a side view of the embodiment of the signal sensor 104 shown in FIGS. 3-5, according to an example embodiment. Because the illustrated side view is illustrative of one contemplated example embodiment, the embodiment shown in FIG. 6 should not be construed as being limiting in any way.

As shown in FIG. 6, the joint 400 can enable rotation of the signal sensor 104 (and optionally the marking assembly 128) in a y-z plane, among other planes. In various embodiments of the concepts and technologies described herein, the signal sensor 104 can be rotated about the y-z plane and the strength of measured signals and/or signal reception detected by the signal sensor 104 can be tracked during this rotation. Thus, the signal sensor 104 can be rotated to detect differences in signal strength and/or signal reception based on orientation in the y-z plane. It can be appreciated that the signal strength and/or signal reception may change based on orientation in the y-z plane as a result of facing (or not facing) a signal emitter from which the measured signals are transmitted (e.g., the signal emitter may be a satellite, in which case the signal sensor 104 may ideally be rotated in the y-z plane such that the signal sensor 104 faces the satellite). Thus, the rotation of the signal sensor 104 within the y-z plane can be accomplished to identify an ideal orientation of an antenna or other hardware to maximize perceived signal strength and/or signal reception at a particular location. Because the signal sensor 104 can be rotated for other purposes, and because the perceived signal strength and/or signal reception may change for additional and/or alternative reasons, it should be understood that this example is illustrative and therefore should not be construed as being limiting in any way.

It can be appreciated with collective reference to FIGS. 1A-6, that the signal sensor 104 can be moved in a variety of directions and/or orientations. These movements can be made independently and/or in coordination with one another. In particular, the antenna placement determination device 100 can be used to locate the signal sensor 104 at almost any geographic location. The extendible arm 108 can be extended or collapsed to locate the signal sensor 104 at almost any height (that can be accommodated by the extendible arm 108). The joint 400 can also be manipulated to orient the signal sensor 104 at any orientation within the x-y plane, the z-x plane, the z-y plane, and/or other planes. Thus, the signal sensor 104 can be located and oriented through a variety of locations and orientations so that an ideal mounting location for an antenna or other hardware can be identified by the antenna placement determination device 100. It should be understood that this example is illustrative and therefore should not be construed as being limiting in any way.

Turning now to FIGS. 7A-7B, additional features of the concepts and technologies described herein for providing an antenna placement determination device 100 will be described. As shown in FIG. 7A, the drive system 114 can be modified, in various embodiments. In the embodiment shown in FIG. 7A, the wheels 118 of the drive system 114 have been supplemented or substituted with one or more tracks 700. The tracks 700 can be provided to enhance traction of the drive system 114, to provide stability for the antenna placement determination device 100, and/or for other reasons. Of course, the number of wheels 118 can be varied in some embodiments, and the tracks 700 may include various other structures not shown in FIG. 7A. As such, the illustrated embodiment is illustrative and should not be construed as being limiting in any way.

As shown in FIG. 7B, the drive system 114 of the antenna placement determination device 100 can additionally or alternatively be provided by one or more rotors, propellers, and/or other flight mechanisms ("rotors") 702. Thus, the antenna placement determination device 100 can be configured to fly through, around, and/or within a location or environment to identify a placement location for hardware such as an antenna or the like. Thus, embodiments of the antenna placement determination device 100 can be used for tall buildings, skyscrapers, cell phone towers, trees, cliffs, antenna towers, and/or other structures. It should be understood that this example is illustrative and therefore should not be construed as being limiting in any way.

Figure 8:
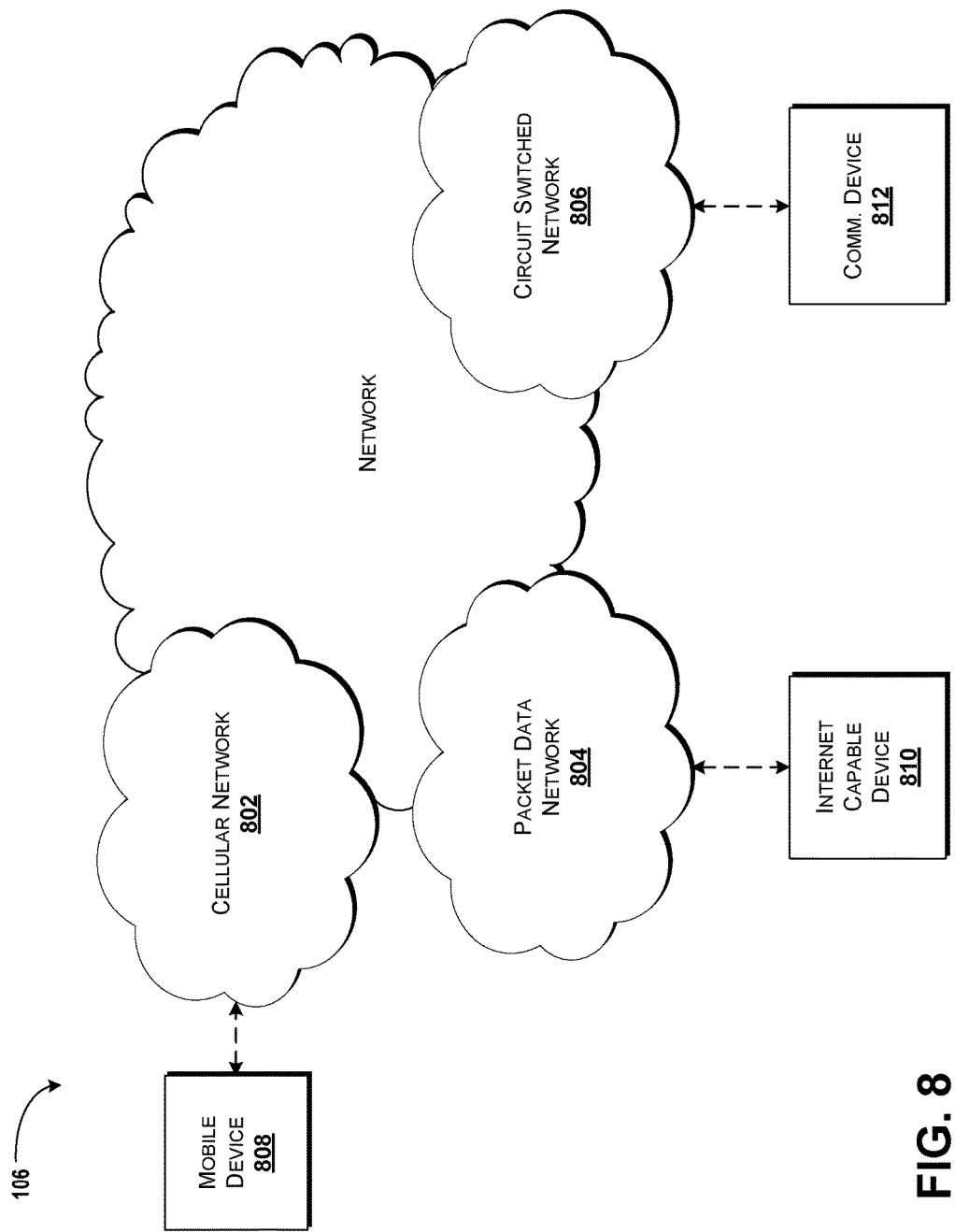
FIG. 8 schematically illustrates a network, according to some illustrative embodiments of the concepts and technologies described herein.

Turning now to FIG. 8, additional details of the network 106 are illustrated, according to an illustrative embodiment. According to various embodiments of the concepts and technologies described herein, the network 106 can include a cellular network 802, a packet data network 804, for example, the Internet, a circuit switched network 806, for example, a publicly switched telephone network ("PSTN"), and/or combinations thereof. The cellular network 802 can include various components such as, but not limited to, base transceiver stations ("BTSs"), Node-B's or e-Node-B's, base station controllers ("BSCs"), radio network controllers ("RNCs"), mobile switching centers ("MSCs"), mobile management entities ("MMEs"), short message service centers ("SMSCs"), multimedia messaging service centers ("MMSCs"), home location registers ("HLRs"), home subscriber servers ("HSSs"), visitor location registers ("VLRs"), charging platforms, billing platforms, voicemail platforms, GPRS core network components, location service nodes, an IP Multimedia Subsystem ("IMS"), and the like. The cellular network 802 also can include radios and nodes for receiving and transmitting voice, data, and combinations thereof to and from radio transceivers, networks, the packet data network 804, and the circuit switched network 806. As such, it can be appreciated that the signal sensor 104 can detect signals emitted from one or more components of the cellular network 802, in various embodiments. It should be understood that this example is illustrative and therefore should not be construed as being limiting in any way.

A mobile communications device 808, such as, for example, a cellular telephone, a user equipment, a mobile terminal, a PDA, a laptop computer, a handheld computer, and combinations thereof, can be operatively connected to the cellular network 802. According to various embodiments of the concepts and technologies described herein, the antenna placement determination device 100 and/or components thereof (e.g., the signal sensor 104, the control system 122, the transceiver 130, and/or combinations thereof) can provide the functionality of the mobile communications device 808. The cellular network 802 can be configured as a 2G GSM network and can provide data communications via GPRS and/or EDGE. Additionally, or alternatively, the cellular network 802 can be configured as a 3G UMTS network and can provide data communications via the HSPA protocol family, for example, HSDPA, EUL (also referred to as HSUPA), and HSPA+. The cellular network 802 also is compatible with 4G mobile communications standards as well as evolved and future mobile standards.

The packet data network 804 includes various devices, for example, servers, computers, databases, and other devices in communication with one another, as is generally known. The packet data network 804 devices are accessible via one or more network links. The servers often store various files that are provided to a requesting device such as, for example, a computer, a terminal, a smartphone, or the like. Typically, the requesting device includes software (a "browser") for executing a web page in a format readable by the browser or other software. Other files and/or data may be accessible via "links" in the retrieved files, as is generally known. In some embodiments, the packet data network 804 includes or is in communication with the Internet. The circuit switched network 806 includes various hardware and software for providing circuit switched communications. The circuit switched network 806 may include, or may be, what is often referred to as a plain old telephone system (POTS). The functionality of a circuit switched network 806 or other circuit-switched network are generally known and will not be described herein in detail.

The illustrated cellular network 802 is shown in communication with the packet data network 804 and a circuit switched network 806, though it should be appreciated that this is not necessarily the case. One or more Internet-capable devices 810, for example, a PC, a laptop, a portable device, the antenna placement determination device 100, or another suitable device, can communicate with one or more cellular networks 802, and devices connected thereto, through the packet data network 804. It also should be appreciated that the Internet-capable device 810 can communicate with the packet data network 804 through the circuit switched network 806, the cellular network 802, and/or via other networks (not illustrated).

As illustrated, a communications device 812, for example, a telephone, facsimile machine, the antenna placement determination device 100, modem, computer, or the like, can be in communication with the circuit switched network 806, and therethrough to the packet data network 804 and/or the cellular network 802. It should be appreciated that the communications device 812 can be an Internet-capable device, and can be substantially similar to the Internet-capable device 810. In the specification, the network 106 is used to refer broadly to any combination of the networks 802, 804, 806. It should be appreciated that substantially all of the functionality described with reference to the network 106 can be performed by the cellular network 802, the packet data network 804, and/or the circuit switched network 806, alone or in combination with other networks, network elements, and the like.

Figure 9:
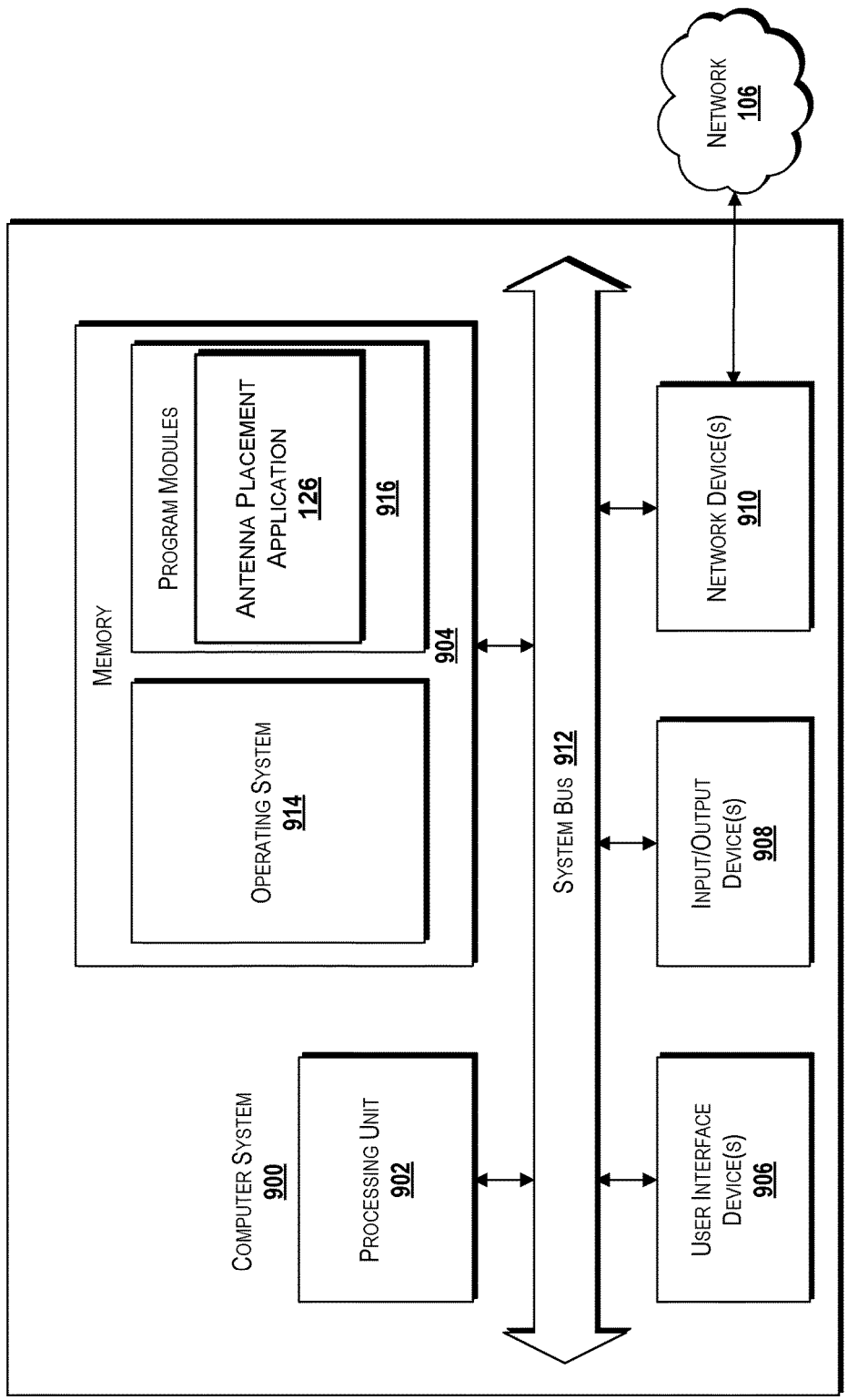
FIG. 9 is a block diagram illustrating one contemplated embodiment of the control system of the antenna placement determination device, according to some illustrative embodiments of the concepts and technologies described herein.

FIG. 9 is a block diagram illustrating a computer system 900 configured to provide the functionality described herein for the control system 122 of the antenna placement determination device 100, in accordance with various embodiments of the concepts and technologies disclosed herein. The computer system 900 includes a processing unit 902, a memory 904, one or more user interface devices 906, one or more input/output ("I/O") devices 908, and one or more network devices 910, each of which is operatively connected to a system bus 912. The bus 912 enables bi-directional communication between the processing unit 902, the memory 904, the user interface devices 906, the I/O devices 908, and the network devices 910.

The processing unit 902 may be a standard central processor that performs arithmetic and logical operations, a more specific purpose programmable logic controller ("PLC"), a programmable gate array, or other type of processor known to those skilled in the art and suitable for controlling the operation of the server computer. As used herein, the word "processor" and/or the phrase "processing unit" when used with regard to any architecture or system can include multiple processors or processing units distributed across and/or operating in parallel in a single machine or in multiple machines. Furthermore, processors and/or processing units can be used to support virtual processing environments. Processors and processing units also can include state machines, application-specific integrated circuits ("ASICs"), combinations thereof, or the like. Because processors and/or processing units are generally known, the processors and processing units disclosed herein will not be described in further detail herein.

The memory 904 communicates with the processing unit 902 via the system bus 912. In some embodiments, the memory 904 is operatively connected to a memory controller (not shown) that enables communication with the processing unit 902 via the system bus 912. The memory 904 includes an operating system 914 and one or more program modules 916. The operating system 914 can include, but is not limited to, members of the WINDOWS, WINDOWS CE, and/or WINDOWS MOBILE families of operating systems from MICROSOFT CORPORATION, the LINUX family of operating systems, the SYMBIAN family of operating systems from SYMBIAN LIMITED, the BREW family of operating systems from QUALCOMM CORPORATION, the MAC OS, iOS, and/or LEOPARD families of operating systems from APPLE CORPORATION, the FREEBSD family of operating systems, the SOLARIS family of operating systems from ORACLE CORPORATION, other operating systems, and the like.

The program modules 916 may include various software and/or program modules described herein. In some embodiments, for example, the program modules 916 include the antenna placement application 126. This and/or other programs can be embodied in computer-readable media containing instructions that, when executed by the processing unit 902, perform various operations for detecting signal strength, marking locations, and/or generating and/or transmitting the placement data 134 as described in detail above with respect to FIGS. 1A-7B. According to embodiments, the program modules 916 may be embodied in hardware, software, firmware, or any combination thereof. Although not shown in FIG. 9, it should be understood that the memory 904 also can be configured to store the placement data 134 and/or other data, if desired.

In one contemplated embodiment of the concepts and technologies described herein, the antenna placement application 126 can include instructions stored in the memory 904, and instructions can be executed by a processor associated with the control system 122 (e.g., the processing unit 902) to perform the following operations: receive a command to scout an area for an antenna placement location (or an optimal signal strength); begin movement around a perimeter of the area; while moving around the perimeter, extend and collapse the extendible arm 108 and rotate the signal sensor 104 through at least one plane (or through all planes, in some embodiments); measure detected signal strength at various intervals (e.g., every microsecond, every ten microseconds, every one hundred microseconds, every second, or the like); determine a geographic location (e.g., using a GPS receiver) at various intervals (e.g., every microsecond, every ten microseconds, every one hundred microseconds, every second, or the like); track detected signal strength, orientation of the signal sensor 104, and location of the antenna placement determination device 100; determine an optimal placement of the antenna; and generate and output placement data 134. In some embodiments, the operations also can include causing the marking assembly 128 to mark a location for the antenna when the optimal placement is determined (and/or at other times). It should be understood that this example is illustrative and therefore should not be construed as being limiting in any way.

By way of example, and not limitation, computer-readable media may include any available computer storage media or communication media that can be accessed by the computer system 900. Communication media includes computer-readable instructions, data structures, program modules, or other data in a modulated data signal such as a carrier wave or other transport mechanism and includes any delivery media. The term "modulated data signal" means a signal that has one or more of its characteristics changed or set in a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer-readable media.

Computer storage media includes volatile and non-volatile, removable and non-removable media implemented in any method or technology for storage of information such as computer-readable instructions, data structures, program modules, or other data. Computer storage media includes, but is not limited to, RAM, ROM, Erasable Programmable ROM ("EPROM"), Electrically Erasable Programmable ROM ("EEPROM"), flash memory or other solid state memory technology, CD-ROM, digital versatile disks ("DVD"), or other optical storage, magnetic cassettes, magnetic tape, magnetic disk storage or other magnetic storage devices, or any other medium which can be used to store the desired information and which can be accessed by the computer system 900. In the claims, the phrase "computer storage medium" and variations thereof does not include waves or signals per se and/or communication media as defined herein.

The user interface devices 906 may include one or more devices with which a user accesses the computer system 900. The user interface devices 906 may include, but are not limited to, computers, servers, personal digital assistants, cellular phones, or any suitable computing devices. The I/O devices 908 enable a user to interface with the program modules 916. In one embodiment, the I/O devices 908 are operatively connected to an I/O controller (not shown) that enables communication with the processing unit 902 via the system bus 912. The I/O devices 908 may include one or more input devices, such as, but not limited to, a keyboard, a mouse, or an electronic stylus. Further, the I/O devices 908 may include one or more output devices, such as, but not limited to, a display screen or a printer.

The network devices 910 enable the computer system 900 to communicate with other networks or remote systems via a network, such as the network 106. Examples of the network devices 910 include, but are not limited to, a modem, a radio frequency ("RF") or infrared ("IR") transceiver, a telephonic interface, a bridge, a router, or a network card. The network 106 may include a wireless network such as, but not limited to, a Wireless Local Area Network ("WLAN") such as a WI-FI network, a Wireless Wide Area Network ("WWAN"), a Wireless Personal Area Network ("WPAN") such as BLUETOOTH, a Wireless Metropolitan Area Network ("WMAN") such a WiMAX network, or a cellular network. Alternatively, the network 106 may be a wired network such as, but not limited to, a Wide Area Network ("WAN") such as the Internet, a Local Area Network ("LAN") such as the Ethernet, a wired Personal Area Network ("PAN"), or a wired Metropolitan Area Network ("MAN").

Figure 10:
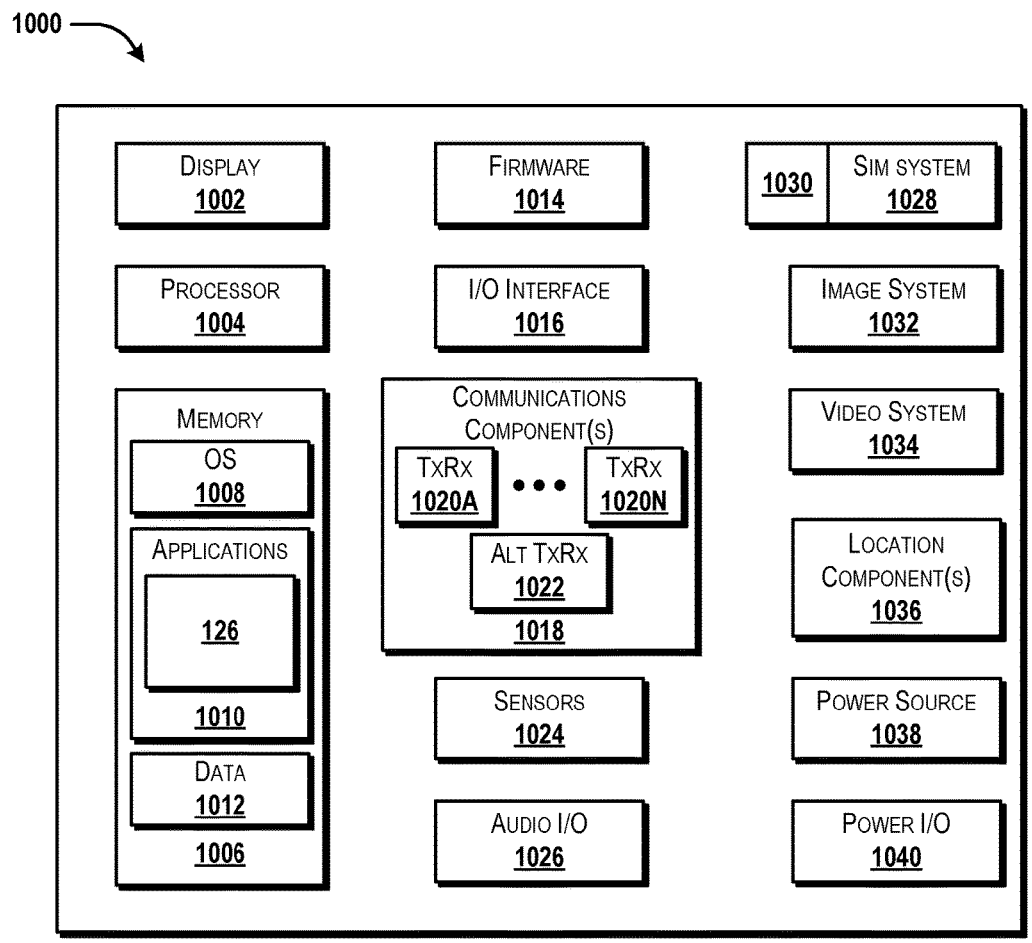
FIG. 10 is a block diagram illustrating another contemplated embodiment of the control system of the antenna placement determination device, according to some illustrative embodiments of the concepts and technologies described herein.

Turning now to FIG. 10, an illustrative mobile device 1000 and components thereof will be described. In some embodiments, the antenna placement determination device 100 and/or the control system 122 of the antenna placement determination device 100 described above with reference to FIGS. 1A-8 can be configured as and/or can have an architecture similar or identical to the mobile device 1000 described herein in FIG. 10. It should be understood, however, that the antenna placement determination device 100 and/or the control system 122 may or may not include the functionality described herein with reference to FIG. 10. While connections are not shown between the various components illustrated in FIG. 10, it should be understood that some, none, or all of the components illustrated in FIG. 10 can be configured to interact with one other to carry out various device functions. In some embodiments, the components are arranged so as to communicate via one or more busses (not shown). Thus, it should be understood that FIG. 10 and the following description are intended to provide a general understanding of a suitable environment in which various aspects of embodiments can be implemented, and should not be construed as being limiting in any way.

As illustrated in FIG. 10, the mobile device 1000 can include a display 1002 for displaying data. According to various embodiments, the display 1002 can be configured to display various graphical user interface ("GUI") elements for outputting an ideal mounting location, receiving and/or outputting commands from or for a technician 208, text, images, video, virtual keypads and/or keyboards, messaging data, notification messages, metadata, internet content, device status, time, date, calendar data, device preferences, map and location data, combinations thereof, and/or the like. The mobile device 1000 also can include a processor 1004 and a memory or other data storage device ("memory") 1006. The processor 1004 can be configured to process data and/or can execute computer-executable instructions stored in the memory 1006. The computer-executable instructions executed by the processor 1004 can include, for example, an operating system 1008, one or more applications 1010 such as the antenna placement application 126, other computer-executable instructions stored in a memory 1006, or the like. In some embodiments, the applications 1010 also can include a UI application (not illustrated in FIG. 10).

The UI application can interface with the operating system 1008, such as the operating system 124 shown in FIG. 1B, to facilitate user interaction with functionality and/or data stored at the mobile device 1000 and/or stored elsewhere. In some embodiments, the operating system 1008 can include a member of the SYMBIAN OS family of operating systems from SYMBIAN LIMITED, a member of the WINDOWS MOBILE OS and/or WINDOWS PHONE OS families of operating systems from MICROSOFT CORPORATION, a member of the PALM WEBOS family of operating systems from HEWLETT PACKARD CORPORATION, a member of the BLACKBERRY OS family of operating systems from RESEARCH IN MOTION LIMITED, a member of the IOS family of operating systems from APPLE INC., a member of the ANDROID OS family of operating systems from GOOGLE INC., and/or other operating systems. These operating systems are merely illustrative of some contemplated operating systems that may be used in accordance with various embodiments of the concepts and technologies described herein and therefore should not be construed as being limiting in any way.

The UI application can be executed by the processor 1004 to aid a user in entering content, showing current geographic location information, showing orientation information for the signal sensor 104, showing perceived signal strength at the signal sensor 104, configuring settings, manipulating address book content and/or settings, multimode interaction, interacting with other applications 1010, and otherwise facilitating user interaction with the operating system 1008, the applications 1010, and/or other types or instances of data 1012 that can be stored at the mobile device 1000. The data 1012 can include, for example, the placement data 134 and/or other information or data. According to various embodiments, the data 1012 can include, for example, presence applications, visual voice mail applications, messaging applications, text-to-speech and speech-to-text applications, add-ons, plug-ins, email applications, music applications, video applications, camera applications, location-based service applications, power conservation applications, game applications, productivity applications, entertainment applications, enterprise applications, combinations thereof, and the like. The applications 1010, the data 1012, and/or portions thereof can be stored in the memory 1006 and/or in a firmware 1014, and can be executed by the processor 1004. The firmware 1014 also can store code for execution during device power up and power down operations. It can be appreciated that the firmware 1014 can be stored in a volatile or non-volatile data storage device including, but not limited to, the memory 1006 and/or a portion thereof.

The mobile device 1000 also can include an input/output ("I/O") interface 1016. The I/O interface 1016 can be configured to support the input/output of data such as location information, placement data 134, user information, organization information, presence status information, user IDs, passwords, and application initiation (start-up) requests. In some embodiments, the I/O interface 1016 can include a hardwire connection such as a universal serial bus ("USB") port, a mini-USB port, a micro-USB port, an audio jack, a PS2 port, an IEEE 1394 ("FIREWIRE") port, a serial port, a parallel port, an Ethernet (RJ45) port, an RJ11 port, a proprietary port, combinations thereof, or the like. In some embodiments, the mobile device 1000 can be configured to synchronize with another device to transfer content to and/or from the mobile device 1000. In some embodiments, the mobile device 1000 can be configured to receive updates to one or more of the applications 1010 via the I/O interface 1016, though this is not necessarily the case. In some embodiments, the I/O interface 1016 accepts I/O devices such as keyboards, keypads, mice, interface tethers, printers, plotters, external storage, touch/multi-touch screens, touch pads, trackballs, joysticks, microphones, remote control devices, displays, projectors, medical equipment (e.g., stethoscopes, heart monitors, and other health metric monitors), modems, routers, external power sources, docking stations, combinations thereof, and the like. It should be appreciated that the I/O interface 1016 may be used for communications between the mobile device 1000 and a network device or local device.

The mobile device 1000 also can include a communications component 1018. The communications component 1018 can be configured to interface with the processor 1004 to facilitate wired and/or wireless communications with one or more networks such as the network 106 described herein. In some embodiments, other networks include networks that utilize non-cellular wireless technologies such as WI-FI or WIMAX. In some embodiments, the communications component 1018 includes a multimode communications subsystem for facilitating communications via the cellular network and one or more other networks.

The communications component 1018, in some embodiments, includes one or more transceivers. The one or more transceivers, if included, can be configured to communicate over the same and/or different wireless technology standards with respect to one another. For example, in some embodiments one or more of the transceivers of the communications component 1018 may be configured to communicate using GSM, CDMAONE, CDMA2000, LTE, and various other 2G, 2.5G, 3G, 4G, and greater generation technology standards. Moreover, the communications component 1018 may facilitate communications over various channel access methods (which may or may not be used by the aforementioned standards) including, but not limited to, TDMA, FDMA, W-CDMA, OFDM, SDMA, and the like.

In addition, the communications component 1018 may facilitate data communications using GPRS, EDGE, the HSPA protocol family including HSDPA, EUL or otherwise termed HSUPA, HSPA+, and various other current and future wireless data access standards. In the illustrated embodiment, the communications component 1018 can include a first transceiver ("TxRx") 1020A that can operate in a first communications mode (e.g., GSM). The communications component 1018 also can include an N$^{th}$ transceiver ("TxRx") 1020N that can operate in a second communications mode relative to the first transceiver 1020A (e.g., UMTS). While two transceivers 1020A-N (hereinafter collectively and/or generically referred to as "transceivers 1020") are shown in FIG. 10, it should be appreciated that less than two, two, and/or more than two transceivers 1020 can be included in the communications component 1018.

The communications component 1018 also can include an alternative transceiver ("Alt TxRx") 1022 for supporting other types and/or standards of communications. According to various contemplated embodiments, the alternative transceiver 1022 can communicate using various communications technologies such as, for example, WI-FI, WIMAX, BLUETOOTH, infrared, infrared data association ("IRDA"), near field communications ("NFC"), other RF technologies, combinations thereof, and the like. In some embodiments, the communications component 1018 also can facilitate reception from terrestrial radio networks, digital satellite radio networks, internet-based radio service networks, combinations thereof, and the like. The communications component 1018 can process data from a network such as the Internet, an intranet, a broadband network, a WI-FI hotspot, an Internet service provider ("ISP"), a digital subscriber line ("DSL") provider, a broadband provider, combinations thereof, or the like.

The mobile device 1000 also can include one or more sensors 1024. The sensors 1024 can include temperature sensors, light sensors, air quality sensors, movement sensors, orientation sensors, noise sensors, proximity sensors, or the like. As such, it should be understood that the sensors 1024 can include, but are not limited to, accelerometers, magnetometers, gyroscopes, infrared sensors, noise sensors, microphones, combinations thereof, or the like. Additionally, audio capabilities for the mobile device 1000 may be provided by an audio I/O component 1026. The audio I/O component 1026 of the mobile device 1000 can include one or more speakers for the output of audio signals, one or more microphones for the collection and/or input of audio signals, and/or other audio input and/or output devices.

The illustrated mobile device 1000 also can include a subscriber identity module ("SIM") system 1028. The SIM system 1028 can include a universal SIM ("USIM"), a universal integrated circuit card ("UICC") and/or other identity devices. The SIM system 1028 can include and/or can be connected to or inserted into an interface such as a slot interface 1030. In some embodiments, the slot interface 1030 can be configured to accept insertion of other identity cards or modules for accessing various types of networks. Additionally, or alternatively, the slot interface 1030 can be configured to accept multiple subscriber identity cards. Because other devices and/or modules for identifying users and/or the mobile device 1000 are contemplated, it should be understood that these embodiments are illustrative, and should not be construed as being limiting in any way.

The mobile device 1000 also can include an image capture and processing system 1032 ("image system"). The image system 1032 can be configured to capture or otherwise obtain photos, videos, and/or other visual information. As such, the image system 1032 can include cameras, lenses, charge-coupled devices ("CCDs"), combinations thereof, or the like. The mobile device 1000 may also include a video system 1034. The video system 1034 can be configured to capture, process, record, modify, and/or store video content. Photos and videos obtained using the image system 1032 and the video system 1034, respectively, may be added as message content to an MMS message, email message, and sent to another mobile device. The video and/or photo content also can be shared with other devices via various types of data transfers via wired and/or wireless communication devices as described herein.

The mobile device 1000 also can include one or more location components 1036. The location components 1036 can be configured to send and/or receive signals to determine a geographic location of the mobile device 1000. According to various embodiments, the location components 1036 can send and/or receive signals from global positioning system ("GPS") devices, assisted-GPS ("A-GPS") devices, WI-FI/WIMAX and/or cellular network triangulation data, combinations thereof, and the like. The location component 1036 also can be configured to communicate with the communications component 1018 to retrieve triangulation data for determining a location of the mobile device 1000. In some embodiments, the location component 1036 can interface with cellular network nodes, telephone lines, satellites, location transmitters and/or beacons, wireless network transmitters and receivers, combinations thereof, and the like. In some embodiments, the location component 1036 can include and/or can communicate with one or more of the sensors 1024 such as a compass, an accelerometer, and/or a gyroscope to determine the orientation of the mobile device 1000. Using the location component 1036, the mobile device 1000 can generate and/or receive data to identify its geographic location, or to transmit data used by other devices to determine the location of the mobile device 1000. The location component 1036 may include multiple components for determining the location and/or orientation of the mobile device 1000.

The illustrated mobile device 1000 also can include a power source 1038. The power source 1038 can include one or more batteries, power supplies, power cells, and/or other power subsystems including alternating current ("AC") and/or direct current ("DC") power devices. The power source 1038 also can interface with an external power system or charging equipment via a power I/O component 1040. Because the mobile device 1000 can include additional and/or alternative components, the above embodiment should be understood as being illustrative of one possible antenna placement determination device for various embodiments of the concepts and technologies described herein. The described embodiment of the mobile device 1000 is illustrative, and should not be construed as being limiting in any way.

Based on the foregoing, it should be appreciated that an antenna placement determination device and methods for using an antenna placement determination device have been disclosed herein. Although some of the subject matter presented herein has been described in language specific to computer structural features, methodological and transformative acts, specific computing machinery, and computer-readable media, it is to be understood that the concepts and technologies disclosed herein are not necessarily limited to the specific features, acts, or media described herein. Rather, the specific structures, devices, features, acts, and media are disclosed as example forms of implementing the concepts and technologies disclosed herein.

The subject matter described above is provided by way of illustration only and should not be construed as limiting. Various modifications and changes may be made to the subject matter described herein without following the example embodiments and applications illustrated and described, and without departing from the true spirit and scope of the embodiments of the concepts and technologies disclosed herein.

We claim:

1. An antenna placement determination device comprising:

a signal sensor located proximate to a first end of an extendible arm, wherein the signal sensor is connected to the extendible arm by a joint, and wherein the signal sensor is configured to be rotated about the joint;

a platform located proximate to a second end of the extendible arm;

an actuator connected to the extendible arm, wherein the actuator is configured to extend and collapse the extendible arm;

a drive system connected to the platform, wherein the drive system comprises a drive motor and a drive mechanism; and a marking mechanism located proximate to the first end of the extendible arm, wherein the marking mechanism is configured to mark a location at which an antenna should be mounted.

2. The antenna placement determination device of claim 1, wherein the marking mechanism comprises a paint nozzle.

3. The antenna placement determination device of claim 1, wherein the drive mechanism comprises a plurality of wheels, and one wheel of the plurality of wheels is powered by the drive motor.

4. The antenna placement determination device of claim 1, further comprising a control system and a transceiver, wherein the control system is configured to generate placement data and transmit the placement data directed to a remote device via the transceiver.

5. The antenna placement determination device of claim 4, wherein the placement data comprises:

location data that indicates a geographic location of the antenna placement determination device;

height data that indicates a height of the extendible arm; and orientation data that indicates an orientation of the signal sensor.

6. The antenna placement determination device of claim 5, wherein the control system determines the height data by tracking movement of the extendible arm by the actuator.

7. The antenna placement determination device of claim 1, wherein the drive mechanism comprises a plurality of propellers that are powered by the drive motor.

8. The antenna placement determination device of claim 1, wherein the drive mechanism comprises a plurality of tracks.

9. The antenna placement determination device of claim 1, wherein the signal sensor is configured to be rotated about three axes located at the joint.

10. The antenna placement determination device of claim 1, further comprising an assembly that is configured to attach mounting hardware at the location at which the antenna should be mounted.

11. An antenna placement determination device comprising:

a signal sensor located proximate to a first end of an extendible arm, wherein the signal sensor is connected to the extendible arm by a joint, and wherein the signal sensor is configured to be rotated about the joint;

a platform located proximate to a second end of the extendible arm;

an actuator connected to the extendible arm, wherein the actuator is configured to extend and collapse the extendible arm;

a drive system connected to the platform, wherein the drive system comprises a drive motor and a drive mechanism, and wherein the drive system is configured to transport the antenna placement determination device;

a control system that controls the drive motor and the actuator; and a marking assembly that is located proximate to the first end of the extendible arm, wherein the marking assembly comprises a marking mechanism that is configured to mark a location at which an antenna should be mounted.

12. The antenna placement determination device of claim 11, further comprising a transceiver, wherein the control system is configured to generate placement data and transmit the placement data directed to a remote device via the transceiver.

13. The antenna placement determination device of claim 12, wherein the placement data comprises:

location data that indicates a geographic location of the antenna placement determination device;

height data that indicates a height of the extendible arm; and orientation data that indicates an orientation of the signal sensor.

14. The antenna placement determination device of claim 11, wherein the drive mechanism comprises a plurality of tracks.

15. The antenna placement determination device of claim 11, wherein the drive mechanism comprises a plurality of wheels, and one wheel of the plurality of wheels is powered by the drive motor.

16. The antenna placement determination device of claim 11, further comprising an assembly that is configured to attach mounting hardware at the location at which the antenna should be mounted.

17. An antenna placement determination device comprising:

a signal sensor located proximate to a first end of an extendible arm, wherein the signal sensor is connected to the extendible arm by a joint, and wherein the signal sensor is configured to be rotated about the joint;

a platform located proximate to a second end of the extendible arm;

an actuator connected to the extendible arm, wherein the actuator is configured to extend and collapse the extendible arm;

a drive system connected to the platform, wherein the drive system comprises a drive motor and a plurality of wheels, and wherein the drive system is configured to transport the antenna placement determination device;

a control system that controls the drive motor and the actuator; and a marking assembly that is located proximate to the first end of the extendible arm, wherein the marking assembly comprises a marking mechanism that is used to mark a location at which an antenna associated with customer premises equipment should be mounted.

18. The antenna placement determination device of claim 17, further comprising a transceiver, wherein the control system is configured to generate placement data and transmit the placement data directed to a remote device via the transceiver.

19. The antenna placement determination device of claim 18, wherein the placement data comprises:

location data that indicates a geographic location of the antenna placement determination device;

height data that indicates a height of the extendible arm; and orientation data that indicates an orientation of the signal sensor.

20. The antenna placement determination device of claim 19, wherein the control system determines the height data by tracking movement of the extendible arm by the actuator.

* * * * *